United States Patent [19]

Harvey

[11] Patent Number: 5,008,798
[45] Date of Patent: Apr. 16, 1991

[54] COMPACT HIGH VOLTAGE POWER SUPPLY

[75] Inventor: Robin T. Harvey, Thousand Oaks, Calif.

[73] Assignee: Hughes Aircraft Company, Los Angeles, Calif.

[21] Appl. No.: 454,675

[22] Filed: Dec. 21, 1989

[51] Int. Cl.⁵ .............................................. H02M 3/18
[52] U.S. Cl. ...................................... 363/59; 307/110
[58] Field of Search .............. 320/1; 363/59; 307/110

[56] References Cited

U.S. PATENT DOCUMENTS

| | | | |
|---|---|---|---|
| 2,534,758 | 12/1950 | Titterton | 307/110 |
| 3,111,594 | 11/1963 | Stolte | 307/110 |
| 3,497,792 | 2/1970 | Mlynar | 307/110 |
| 3,505,533 | 4/1970 | Bernstein et al. | 307/110 |
| 3,513,376 | 5/1970 | Hajek | 307/110 |
| 3,714,510 | 1/1973 | Hofmann | 315/267 |
| 3,845,322 | 10/1974 | Aslin | 307/110 |
| 4,011,463 | 3/1977 | Fasching | 307/110 |
| 4,034,260 | 7/1977 | Lutz | 315/344 |
| 4,034,261 | 7/1977 | Lutz et al. | 315/344 |
| 4,091,310 | 5/1978 | Harvey | 315/344 |
| 4,200,821 | 4/1980 | Bekefi et al. | 315/4 |
| 4,247,804 | 1/1981 | Harvey | 315/344 |
| 4,322,661 | 3/1982 | Harvey | 315/344 |
| 4,375,594 | 3/1983 | Ewanizky | 307/110 |
| 4,596,945 | 6/1986 | Schumacher et al. | 315/344 |
| 4,837,661 | 6/1989 | Lherm et al. | 307/110 |
| 4,900,947 | 2/1990 | Weiner et al. | 363/59 |

Primary Examiner—R. Skudy
Assistant Examiner—Jeffrey Sterrett
Attorney, Agent, or Firm—V. D. Duraiswamy; W. K. Denson-Low

[57] ABSTRACT

A high voltage power supply having energy storage, charging and switching elements and using an interruptible switch as the switching element for efficient, compact and safe operation. In a specific embodiment, the interruptible switch is implemented with at least one cold cathode grid-controlled, crossed field plasma switch and associated control circuit. The charging element is a Marx bank which can be capacitive or inductive. Embodiments with a single master-slave control arrangement, a pulse-forming network providing high voltage regulation, an inductive implementation with a plurality of switching elements in a single envelope with the cathode of at least one switching element being the anode of the next switching element are disclosed. A current amplifier and voltage regulator implemented with a cold cathode grid-controlled, crossed field plasma switch having a cathode, an anode and a control grid therebetween are disclosed.

23 Claims, 7 Drawing Sheets $\tau = \dfrac{R_L C}{n}$

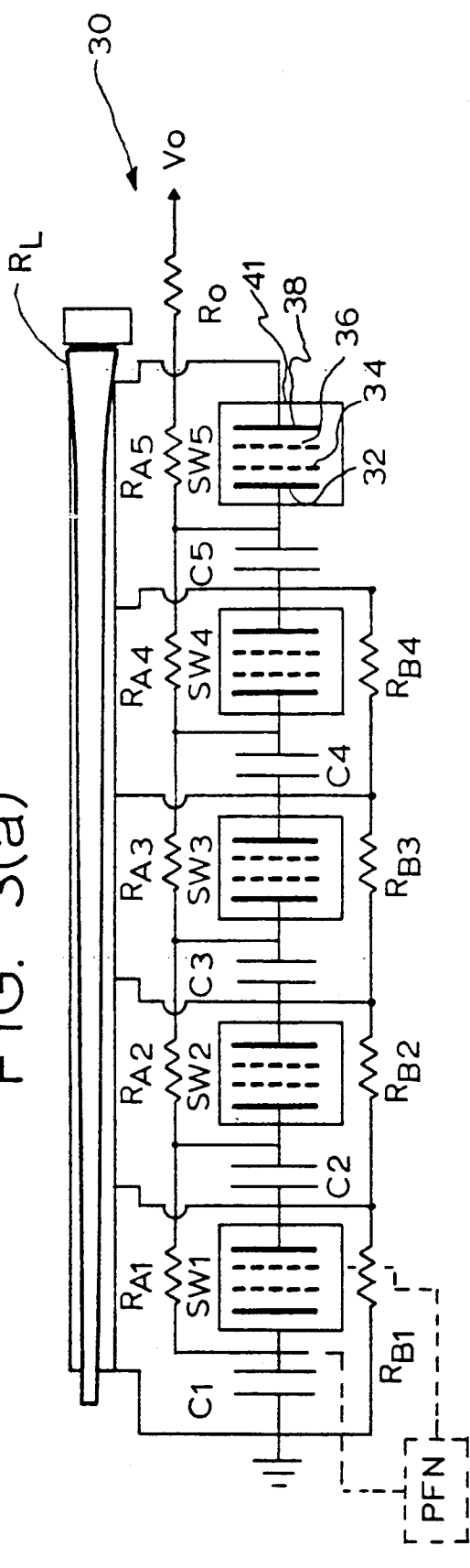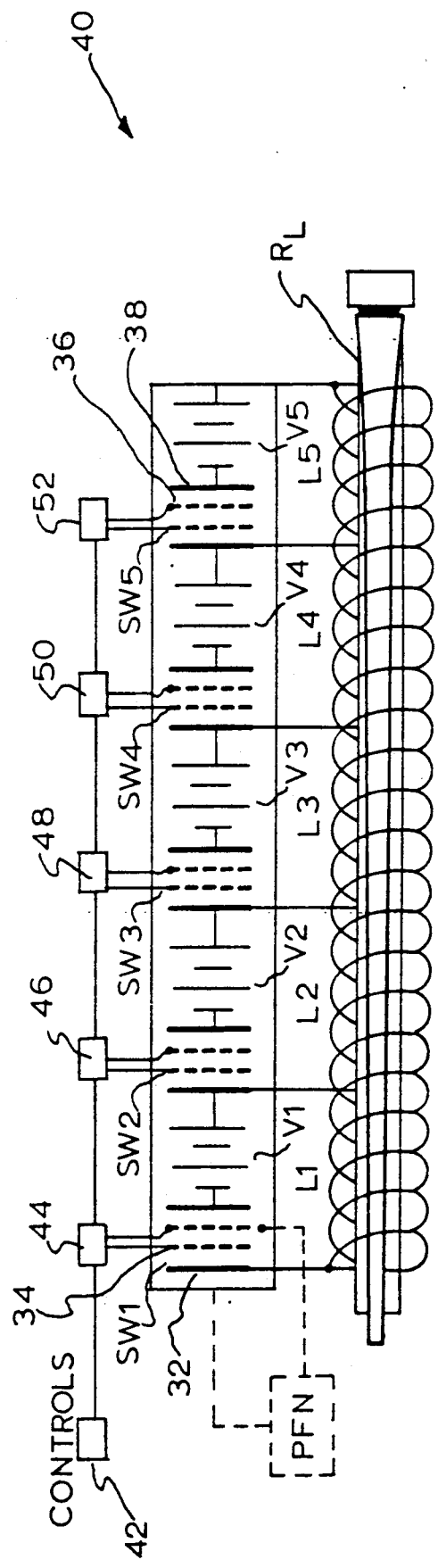

FIG. 4(a)
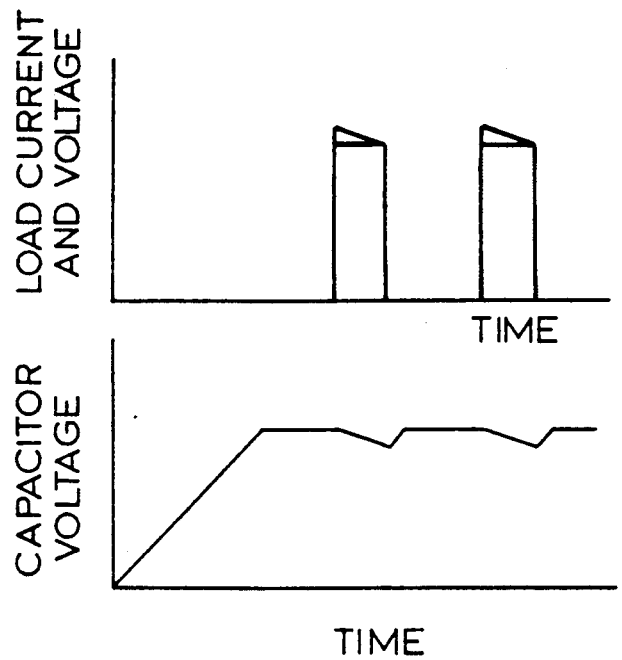
FIG. 4(b)
FIG. 5(a)
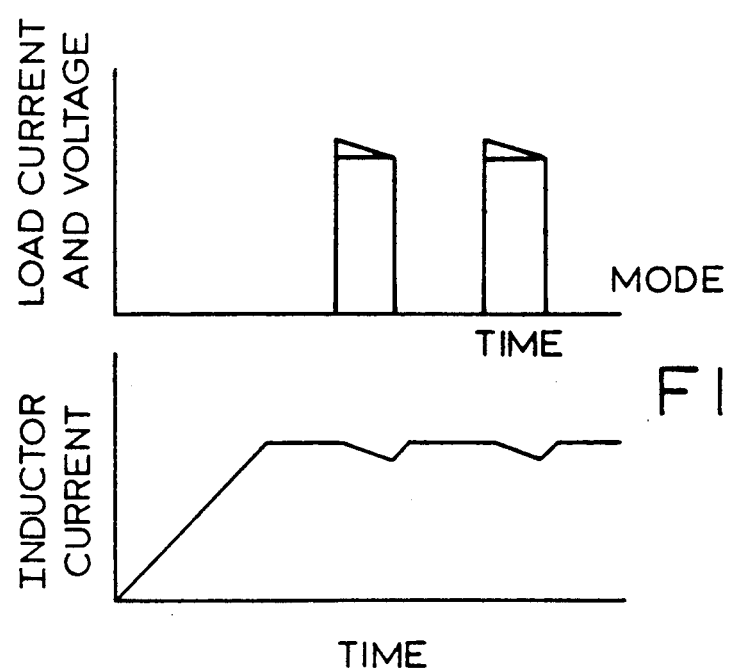
FIG. 5(b)

FIG. 7
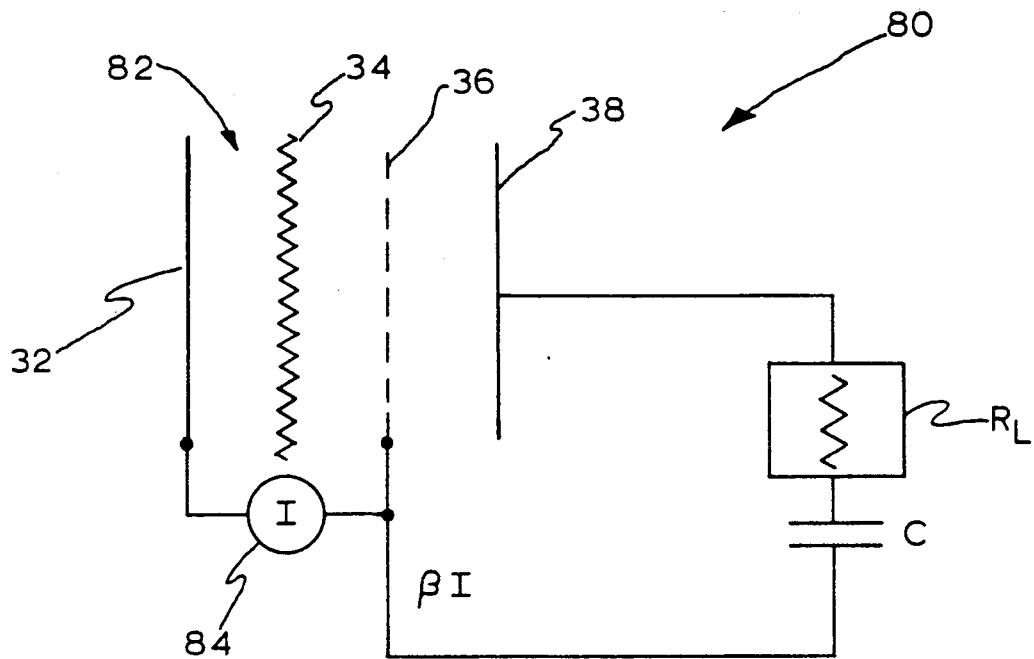
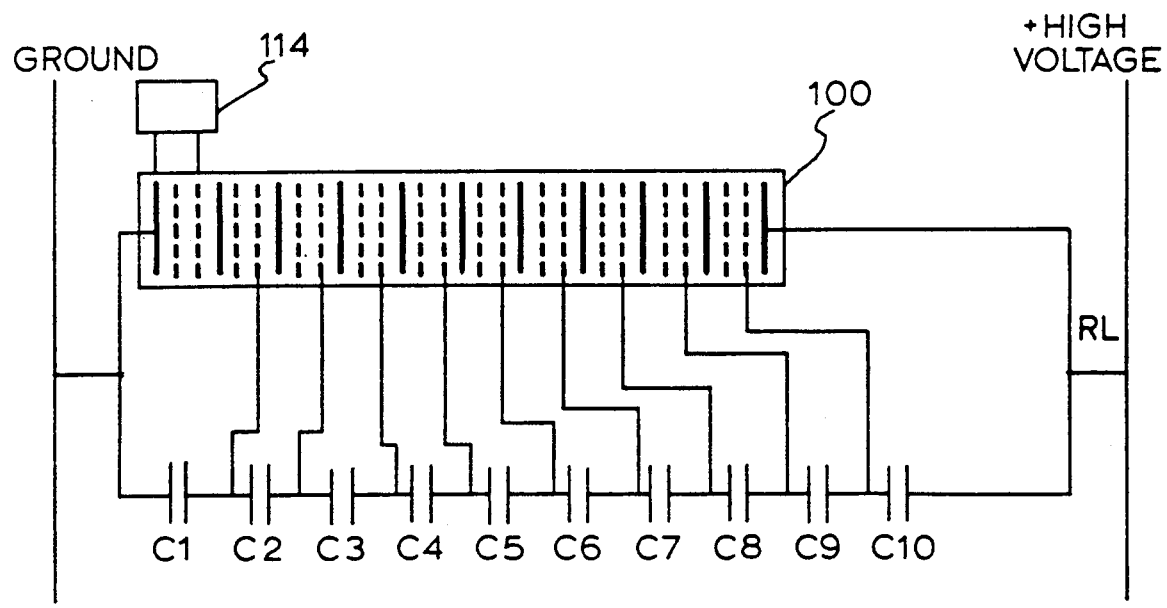
FIG. 9

COMPACT HIGH VOLTAGE POWER SUPPLY

BACKGROUND OF THE INVENTION

1. Field of the Invention

The present invention relates to power supplies and high voltage fault protection. More specifically, the present invention relates to high voltage power supplies for free electron lasers and other devices.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art

Certain devices require a stable high voltage pulse power supply for proper operation. For the purpose of the present invention, a high voltage pulse power supply is a power supply operating at voltages of 100 kilovolts to 1 megavolt at currents in excess of 1 or 2 kiloamperes with microsecond switching times and pulse lengths of tens of microseconds producing constant current or constant voltage waveforms on typical loads.

Typical loads include harmonic amplifiers and free electron lasers (FELs). An FEL, for example, is device in which a beam of electrons is passed through a spatially varying magnetic field. The magnetic field causes electrons in the beam to "wiggle" and radiate energy. In this device, the high voltage power supply performs the function of accelerating electrons to provide the high energy input electron beam. More specifically, FELs and certain other devices require accurate applied voltages on the order of one part in one thousand. Otherwise the frequency and power gain of these devices change with time and produce undesirable results.

Unfortunately, for such applications, it is difficult to sustain the voltage levels for the desired pulse lengths because of the high voltage and current requirements. That is, the high voltage and current levels are difficult to switch and are problematic with respect to arcing and other hazards. For example, operation at high voltage and current levels requires some high energy storage at powers typically in the megawatt range. However, when a megawatt of power is delivered for a second or more, a megajoule of energy is developed. At these energy levels, a failure or an arc may produce an electrical explosion and heat comparable to a pound of explosives. Accordingly, it has been recognized as being desirable to provide power regulation devices and pulse power supplies which operate for short durations with control of pulse length and amplitude while switching on and off at will. An additional class of applications exist within the power utility and power distribution industry. Here better means of controlling high voltage, particularly for interrupting current against high voltages are required.

Current power modulating and regulating technologies include MOSFETS and FETS, GTO/GAT and SCRs, voltage regulator tubes and saturated reactors. Metallic-oxide semiconductor field effect transistors (MOSFETS) and field effect transistors (FETs) are limited in current and voltage handling capability and as with other solidstate devices, these arrays must be carefully snubbed to protect against catastrophic failure. (Snubbing involves the use of auxiliary resistors and capacitors to absorb transients.)

GTO/GAT (gate-turn-off/gate assisted turnoff) devices and SCRs (silicon controlled rectifiers) are limited in speed and voltage and generally have large control power requirements. Voltage regulator tubes are also limited in current handling capability and are unstable in series arrays. Saturated reactors are used to pulse form or sharpen pulses but are not a solution to the general problem of opening switches.

The present high voltage pulse power supply art includes transformers, Marx banks and pulse forming networks. Transformers operating at high voltages have difficulty with respect to the voltage time product. That is, the duration at which a high voltage is sustainable is limited by the nature of the transformer. Increases in sustainable pulse lengths come at a cost in terms of transformer size and weight and in the rise and fall times of the pulse. Output pulse length can not therefore be arbitrarily increased.

Nonetheless, transformers have several features which allow for some degree of tradeoff in design. Typically the tradeoff is between pulse rise time and pulse flatness. Unfortunately, certain devices, such as free-electron lasers, are designed to operate at a specific voltage. When the transformer is initially turned on, before reaching the operating range of the device, the voltage rises through some range in which the device may experience undesirable and perhaps damaging effects. Accordingly, in FEL and other applications, it is not desirable to initiate a pulse with a long rise time as the electron beam will not be properly focused during the rise of the pulse.

A Marx bank is a set of capacitors switched ("erected") from a parallel configuration, in which the capacitors are charged, to a series configuration from which the stored voltage is discharged. Essentially, the erected Marx bank acts as though a simple capacitor is driving the load. While this may be the currently simplest preferred approach, there is a significant problem associated therewith. That is, as the sustainability of the output pulse is defined by the resistive-capacitive (RC) time constant of the device, long steady pulses require long RC time constants. Thus, the extent to which the supply voltage can be sustained at the desired steady state level is dependent on the capacitance of the bank. Unfortunately, as the capacitance of the bank goes up, the hazards associated with the operation of the device go up due to the relationship between the energy stored and the capacitance.

In addition, conventional Marx banks are typically implemented with noninterruptible switches. As a result, as the output current decays exponentially below the specified current range or pulse length the remaining energy stored in the device is essentially wasted. Thus, while slowing the operation, this limitation impacts adversely on the efficiency of the device.

The use of pulse forming networks in lieu of capacitors addresses the shortcoming of conventional Marx banks to some extent. However, elements in the pulse forming networks induce oscillations in the output of the power supply. These oscillations are difficult and expensive to remove and may be unacceptable for certain applications. In addition, Marx banks, composed of pulse forming networks, output at half the voltage level of purely capacitive Marx banks. Therefore, input and stored voltage levels must be twice as high as alternative designs.

Thus, there is a need in the art for an efficient controllable high voltage power supply or regulator/modulator.

SUMMARY OF THE INVENTION

The need in the art is addressed by the high voltage power supply of the present invention which in a most general sense includes an energy storage element, a charging circuit for charging the energy storage element and a switching element for switching the energy storage element into electrical contact with a load. A particularly novel aspect of the invention is the use of an interruptible switch as the switching element. The use of an interruptible switch allows for efficient, safe operation at high voltages.

In a specific embodiment, the interruptible switch is implemented with a cold cathode grid-controlled, crossed field plasma switch. In a first more specific embodiment, the charging element is a capacitive Marx bank. In a second more specific embodiment, the charging element is a novel inductive Marx bank.

The use of cold cathode grid-controlled, crossed field plasma switches requires an associated control circuit. An additional novel aspect of the invention is a teaching by which a single control circuit may be used in a master-slave configuration for the capacitive and inductive Marx bank implementations. The master-slave arrangement allows for the desired pulse control with synchronous operation of the cold cathode grid-controlled, crossed field plasma switches without the requirement of a separate control unit for each switch.

Yet another novel aspect of the invention is the use of a pulse forming network in connection with a cold cathode grid-controlled, crossed field plasma switch to provide a regulator for the power supply.

Additional teachings of patentable significance include an improved cold cathode grid-controlled, crossed field plasma switch, for use in the inductive embodiment, and a current amplifier. The improved cold cathode grid-controlled, crossed field plasma switch includes plural switching elements in a single envelope, each switching element including a cathode, a control grid and an anode, the cathode of at least one switching element being the anode of the next switching element and so on.

The current amplifier is implemented with a cold cathode grid-controlled, crossed field plasma switch having a cathode, an anode and a control grid therebetween. The current amplifier includes circuitry for providing an input current between the cathode and the control grid and circuitry for extracting an output current from the control grid to the anode which is greater than or equal to the input current.

BRIEF DESCRIPTION OF THE DRAWINGS

FIG. 3(a) is a simplified schematic diagram of an illustrative capacitive embodiment of the high voltage power supply of the present invention.

FIG. 3(b), is a simplified schematic diagram of an illustrative inductive embodiment of the high voltage power supply of the present invention.

FIG. 4(a) shows the load current and load voltage of the capacitive embodiment of the invention as a function of time.

FIG. 4(b) shows the circuit voltage of the capacitive embodiment of the invention as a function of time.

FIG. 5(a) shows the load current and load voltage of the inductive embodiment of the invention as a function of time.

FIG. 5(b) shows the circuit current of the inductive embodiment of the invention as function of time.

FIG. 7 shows a simplified schematic diagram of a current amplifier or voltage regulator constructed in accordance with the teachings of the present invention.

FIG. 9 is a capacitive implementation of high voltage power supply of FIG. 8(a) using the compact cold cathode grid-controlled, crossed field plasma switch of the present invention in a transient fault protection circuit.

DESCRIPTION OF THE INVENTION

Illustrative embodiments and exemplary applications will now be described with reference to the accompanying drawings.

Figure 1A:
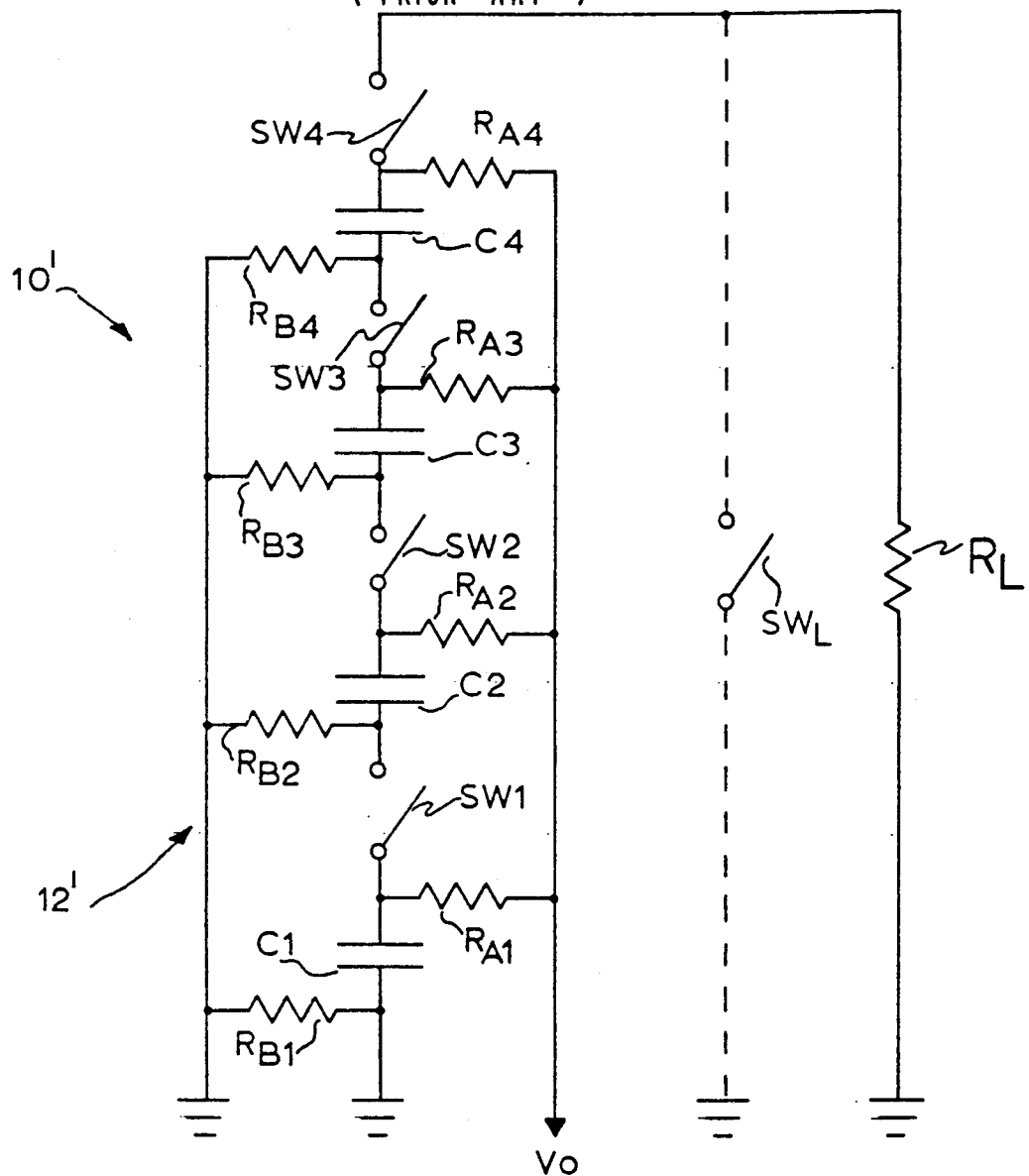
FIG. 1(a) is an illustrative schematic diagram of a simple conventional high voltage pulse power supply implemented with a capacitive Marx bank.

FIG. 1(a) is an illustrative schematic diagram of a simple conventional high voltage pulse power supply system 10' implemented with a capacitive Marx bank 12'. The Marx bank 12' includes a plurality of capacitors, four are shown in FIG. 1, C1, C2, C3 and C4. The capacitors C1–C4 are interconnected through a number of associated switches SW1–SW4 and a load represented as a resistor $R_L$. With the switches SW1–SW4 open, the capacitors C1–C4 are charged in parallel from a source of supply $V_o$ through first and second associated charging resistors $R_A$ and $R_B$. When the capacitors C1–C4 are charged, the switches SW1–SW4 are closed by control circuits not shown. The closure of the switches places the capacitors in a series relation by which a charge current is delivered to the load $R_L$. With the opening of the switches SW1–SW4, the capacitors begin to recharge and the operation is repeated. Thus, a sequence of pulses is delivered to the load by which a current and a voltage would be applied for some duration.

Figure 1B:
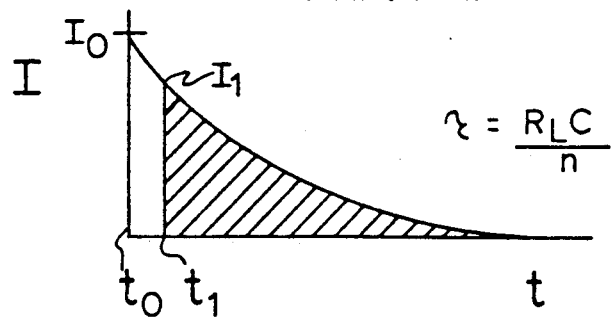
FIG. 1(b) is a graphical representation of the load current of the simple conventional high voltage pulse power supply of, FIG. 1(a).

As shown in FIG. 1(b), the current I through the load $R_L$ decays exponentially from an initial value $I_o$ at the time of switch closure $t_o$ in accordance with the RC time constant $\tau = R_L C/N$, where N is the number of capacitors. For high voltage pulse power supply applications, the useful portion of the output current occurs between time $t_o$ and $t_1$ at which time the output current decays from $I_o$ to $I_1$, respectively. Thus, the energy remaining in the Marx bank 12' following time $t_1$ (shown shades in FIG. 1(b)) is not typically used. The switches SW1-SW4 generally can not be opened prior to the dissipation of this energy below some minimum threshold level. Depending upon the load requirements a "crossbar" switch $SW_L$ may be employed to divert the current from the load at time $t_1$. However, this puts a serious burden upon the capacitor bank as the effective load impedance falls to a low value.

The operation of the conventional system 10' of FIG. 1(a) may be improved somewhat by replacing the capacitors C1-C4 with pulse forming networks $PFN_1$-$PFN_4$ respectively. This is illustrated in the system 20' of FIG. 2(a). (Pulse forming networks are known in the art and may be implemented with capacitive and inductive arrays by way of example.) At time of switch closure $t_o$, the system 20' outputs a current pulse such as that shown in FIG. 2(b). Unfortunately, as shown in FIG. 2(b), the use of pulse forming networks causes some oscillation or ringing 22 in the output current which may adversely affect the operation of the load. Furthermore, the load voltage is only one half of the sum of the PFN voltages.

Figure 2A:
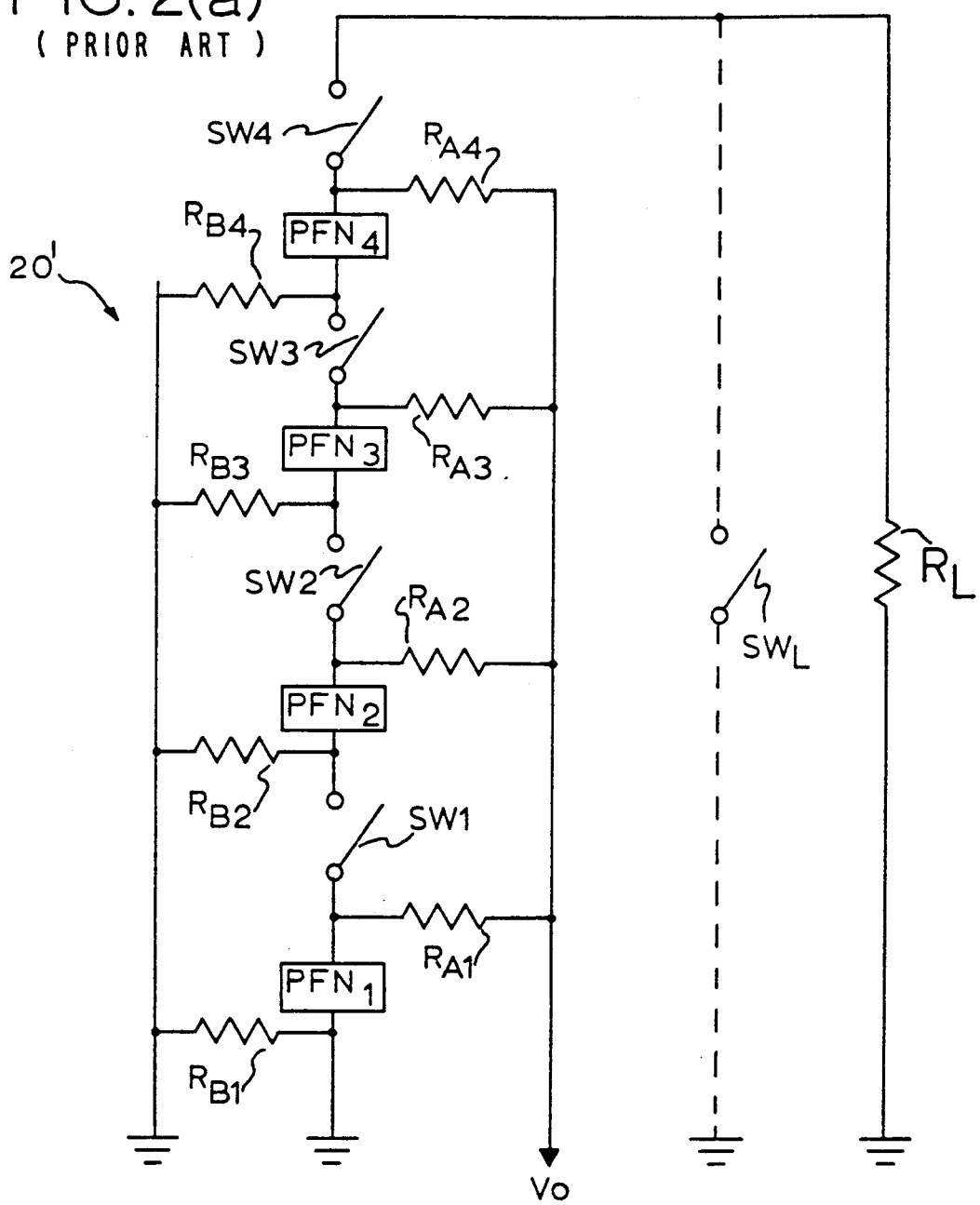
FIG. 2(a) is an alternative embodiment of the high voltage pulse power supply of FIG. 1(a) implemented with pulse forming networks in lieu of capacitors.
Figure 2B:
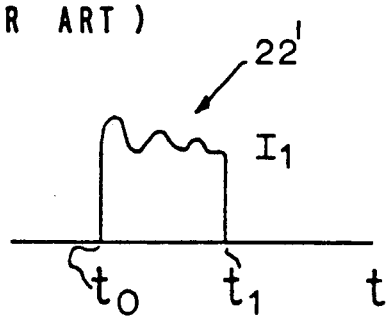
FIG. 2(b) is a graphical representation of the load current of the high voltage power supply of FIG. 2(a).

In any event, the high voltage pulse power supply systems 10' and 20' of FIGS. 1(a) and 2(a), respectively, are implemented with noninterruptible switches. As noted above, the use of noninterruptible switches has limited the performance of conventional Marx bank type high voltage power supplies. Thus, as discussed more fully below, in a most general sense, one of the more significant teachings of the present invention is the use of interruptible switches in place of the noninterruptible switches of conventional systems.

FIG. 3(a) is a simplified schematic diagram of an illustrative capacitive embodiment of a high voltage power supply 30 constructed in accordance with the present teachings. The system 30 includes a bank or array of capacitors C1-C5 with associated first and second charging resistors $R_{A1}$-$R_{A5}$ and $R_{B1}$-$R_{B5}$, respectively. The first resistors $R_{A1}$-$R_{A5}$ are connected to first terminals of associated capacitors C1-C5 at one end, in a voltage divider arrangement, and to the source of supply voltage $V_o$ through a resistor $R_o$. The second charging resistors $R_{B1}$-$R_{B5}$ are connected between the second terminals of the associated capacitors C1-C5 and a ground terminal in a second voltage divider arrangement. The capacitors are charged in parallel to a voltage $V_o$ from a low voltage power supply (not shown).

Between each of the capacitors C1-C5 is an interruptible switch SW1-SW5. In the preferred embodiment, the interruptible switches SW1-SW5 are implemented with cold cathode grid-controlled, crossed field plasma switches. Cold cathode grid-controlled, crossed field plasma switches are known in the art. As described in U.S. Pat. No. 4,247,084, issued to R. Harvey on Jan. 27, 1981, entitled "Cold Cathode Discharge Device and Grid Control" and U.S. Pat. No. 4,596,945, issued to Schumacher et al. on June 24, 1986, entitled "Modulator Switch with Low Voltage Control", a cold cathode grid-controlled, crossed field plasma switch includes a cathode 32, a source grid 34, a control grid 36 and an anode 38 enclosed within a low pressure gas filled chamber 41. Switch control is effectuated by the application of an appropriate potential to the control grid 36 via control circuitry (e.g. source-grid, control-grid, pressure regulator and isolated auxiliary power) not shown. (Isolated power is required for the control circuits since each switch body will pulse to a different voltage with respect to the system ground. Typically, isolated power must be provided via transformers or batteries. Likewise, the trigger signal leads must be isolated, e.g. via fiber-optic cable.)

The load $R_L$ is shown as an electron gun to which a tap is provided from each capacitor via an associated switch. On command to "fire", the capacitors C1-C5 are switched in series and the voltage at the load rises (is "erected") to $N * V_o$, where N is the number of capacitors. The pulse voltage may be distributed over the load in increments of $V_o$ (as shown) or delivered on a single lead. When the desired pulse is completed, the switches are commanded to interrupt, the capacitors are automatically disconnected from the series circuit and are recharged by the low-voltage power supply. As only a small fraction of the voltage may be desired to be drained off on each pulse, the interruptible opening switch capability provided by the cold cathode grid-controlled, crossed field plasma switches of the present invention, is particularly advantageous.

FIG. 3(b) is a simplified schematic diagram of an illustrative inductive embodiment of the high voltage power supply 40 of the present invention. The inductive embodiment is analogous to the capacitive embodiment with the roles of the current and voltage interchanged along with the opening and closing characteristics of each switch. The inductive system 40 includes an inductor L comprising coils L1-L5 circumscribing an E-beam load $R_L$. This positioning is effective to facilitate the distribution of the voltage along the length of the E-beam accelerator tube. A first tap from each coil is connected to the cathode terminal of each of a plurality of associated cold cathode grid-controlled, crossed field plasma switches SW1-SW5 respectively. The anode of each switch SW1-SW5 is connected to the cathode of an associated supply V1-V5. While a distributed supply is shown, a single supply may be used without departing from the scope of the present invention. The anode of the last supply V5 is connected to the remaining end of the inductor L. A plurality of control circuits 42-52 (even numbers only) are shown, with the second through the sixth control circuits 44-52 being connected to the cathode 32 and the source control grids (34 and 36) of the associated switches SW1-SW5. The control circuits 44-52 include keep-alive, and trigger pulse voltages (as described for example in U.S. Pat. No. 4,596,945 issued to Schumacher et al.) and provide proper timing for the operation of the switches. These control units are electrically isolated by isolation transformers or by fiber-optic links, as is well known in the art. It should be understood that a multiplicity of minor circuit rearrangements may be made by one skilled in the art without departing from the scope of the present teachings.

In operation, the switches SW1-SW5 are first turned ON and the series inductor elements L1-L5 are charged with current from the low voltage current supplies V1-V5, respectively. When the desired current I is achieved in the inductive elements L1-L5, the switches SW1-SW5 are interrupted. During the interruption process, the regeneration of plasma is halted in the gap between the control grid 36 and the anode 38 of each switch.

Characteristically, the sweep-out time of plasma from the gap determines the voltage generated by the switch.

In the limit of large inductance, the cold cathode grid-controlled, crossed field plasma switch voltage is given by the approximate expression $$V = V_o(v_t t/x_o + 1)^{4/3} \quad [1]$$
$$\approx Ct^{4/3} \quad [2]$$

where $V_o$ is the conduction voltage of the switch (typically 200 to 500 volts), $v_t$ is the speed of the surface of the ion-cathode sheath as it is eroded near the control grid by the removal of ions from the plasma that are required to carry the switch current, and $x_o$ is the initial thickness of the sheath. Since these microscopic quantities depend on the initial current density and are difficult to determine, it is more practical to empirically determine the parameter $$C = V_o(v_t/x_o)^{4/3} \quad [3]$$

Additionally, the sheath may erode completely back to the anode before the voltage rises high enough for the circuit load to limit any further rise in voltage, in which case, the voltage will abruptly increase to the limit imposed by the circuit.

The typical opening time of a current typical cold cathode grid-controlled, crossed field plasma switch ranges from 0.1 to 1 microsecond, depending on the internal design and the current I. After this time, the voltage, V, rises across the inductors according to $$V = -(LdI/dt + RI) \quad [4]$$

where L is the total inductance of the series-connected inductors and I is the current in the load. When the desired load pulse length has been achieved, the switches are re-closed and the inductor L is recharged. As with the capacitive case, the load connections may be distributed along the inductor L. The resulting pulse shape will depend upon the impedance, R, of the load. Typically, a voltage will develop across a resistive load that jumps to a maximum level, IR, as the switches open, and then decays at a rate determined by the L/R time constant of the combined inductor and load. This is depicted in FIGS. 4(a) and 4(b) with respect to the capacitive embodiment of FIG. 3(a) and in FIGS. 5(a) and 5(b) with respect to the inductive embodiment of FIG. 3(b). That is, FIG. 4(a) shows the load current and voltage of the capacitive embodiment 20 as a function of time, FIG. 4(b) shows the voltage across a capacitor element (C1-C5) of the capacitive embodiment 20 as a function of time, FIG. 5(a) shows the load current and voltage of the inductive embodiment 30 as a function of time, and FIG. 5(b) shows the inductor current of the inductive embodiment 30 as function of time.

Another novel aspect of the present invention is the provision of a high voltage regulator by the addition of a pulse forming network between the cathode 32 and the control grid 36 of one of the cold cathode grid-controlled, crossed field plasma switches in the array of the capacitive embodiment 20 or the inductive embodiment 30 of FIGS. 3(a) and (b) respectively. This arrangement provides a regulator as described in reference to FIG. 7. Under normal operating conditions the anode current cannot exceed the current flowing between the control grid 36 and the cathode 32. By adjusting the current, I, with the pulse-forming network, the effective impedance of the tube can be made an adjustable fraction of the load voltage RL, thereby causing a controllable fraction of the voltage to be dropped across the tube. By making this fraction high at the start of the load pulse and falling with time, the normal voltage drop can be compensated, and a square wave, or other desirable wave form generated.

Figure 6A:
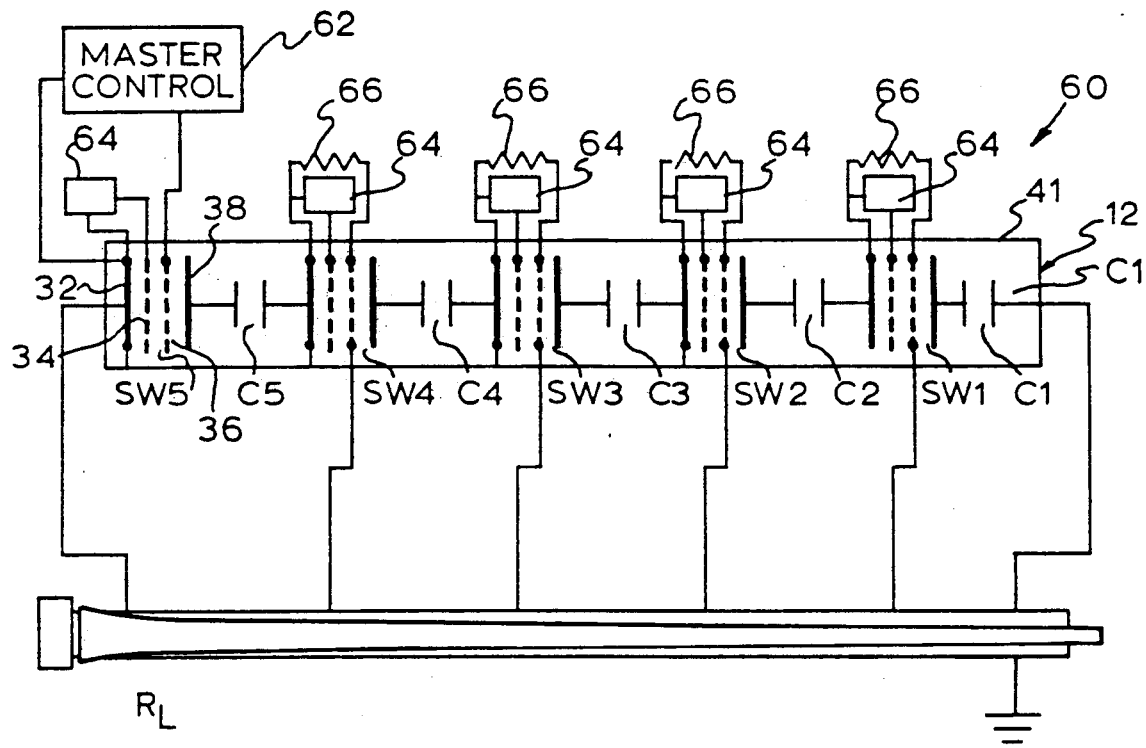
FIG. 6(a) is a schematic diagram of an illustrative capacitive embodiment of the high voltage power supply of the present invention implemented with a master-slave configuration.

FIG. 6(a) is a schematic diagram of an illustrative capacitive embodiment of the high voltage power supply of the present invention implemented with a master-slave control arrangement. The system 60 includes the capacitive Marx bank 12 of FIG. 3(a) with the five switches SW1-SW5 and associated capacitors C1-C5 encased within a single enclosure 41. The charging resistors have been omitted for the purpose of illustration. A single master control pulser 62 is connected between the cathode 32 and control grid 36 of the fifth switch SWI. The master control unit includes any desired regulating elements and provides the control signals necessary to turn on the first switch SW1.

A keep alive unit 64 is provided for each switch. The keep alive unit of the first switch SWI is connected to the cathode 32 and source grid 34 thereof. The keep alive unit of the second through fifth switches SW2-SW5 are connected to the cathode 32 and source grids 34 thereof. The keep alive units 64 are essentially dc power supplies which serve to maintain a small potential on the source terminal to maintain each cold cathode grid-controlled, crossed field plasma switch in a standby mode. (If submicrosecond response times are required an additional source current pulser would be utilized.) The cathodes 32 of the first four switches SW1-SW4 are connected to the capacitors C1-C5 and the control grids 36 are connected to taps on the load (shown here as an electron beam accelerator).

Pull down resistors 66 are connected between the control grid 36 and the cathode 32 of the second through the fifth switches SW2-SW5. The pull down resistors are chosen to insure the proper voltage levels for the slaving of the second through the fifth switches SW2-SW5 off of the first switch SWI during periods when the load is not activated.

Figure 6B:
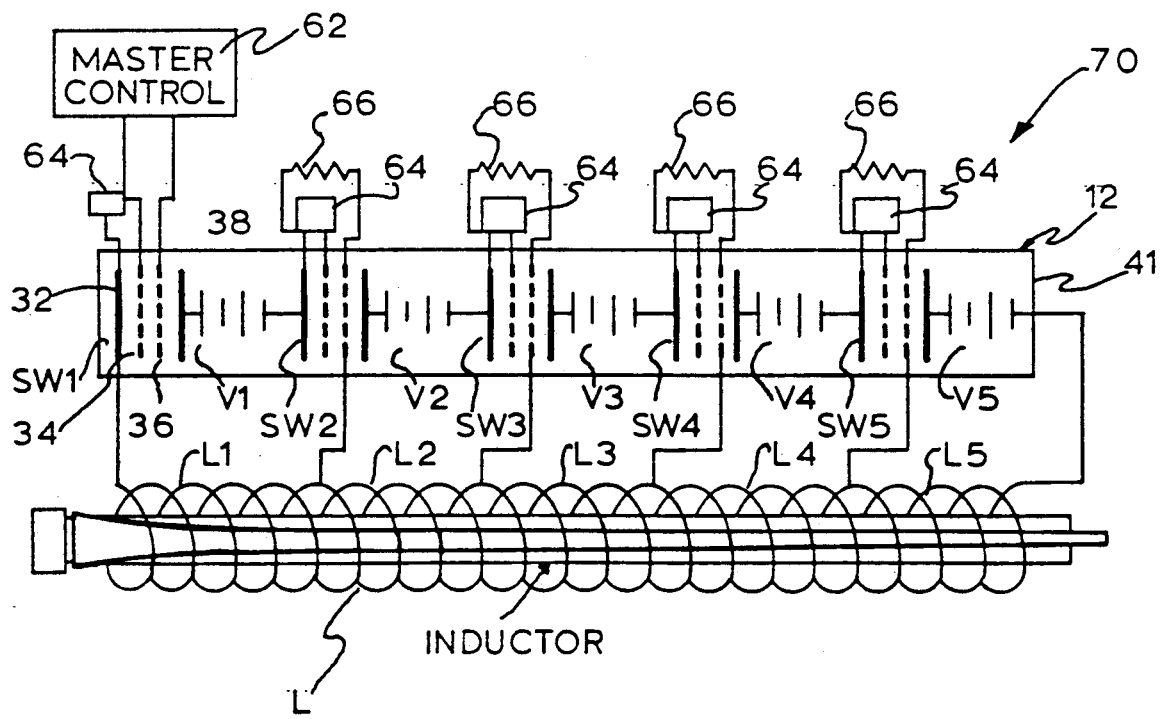
FIG. 6(b) is a schematic diagram of an illustrative alternative inductive embodiment of the high voltage power supply of the present invention implemented in the master-slave configuration.

FIG. 6(b) is a schematic diagram of an illustrative alternative inductive embodiment of the high voltage power supply of the present invention implemented with the master-slave control arrangement. The system 70 of FIG. 6(b) is configured similar to the system 60 of FIG. 6(a) with the Marx bank 12 having low voltage power supplies V1-V5 for example, such as batteries, instead of the capacitors C1-C5 shown in the example of FIG. 6(a). The systems 70 of FIG. 6(b) is in the master-slave configuration of FIG. 6(a) with the exception that the connection between the control grids 36 of the second through the fifth switches SW2-SW5 are facilitated by the coils L1-L4 of the inductor L. Here the individual switches SW1-SW4 are only provided with keep-alive power drawn from the supplies V1-V5.

The operation of the switches in the inductive system 70 is analogous to that of the capacitive system 60 with the effect of the ON and OFF states intercharged. The closing time of the switches is at most N times the closing time of a single switch. The charging time of the inductor may be considerably longer. After the inductor L is charged, a burst of pulses may be generated by turning the switches OFF and ON repetitively at a rate and pulse length determined by the master control 62. Turning the first switch SWI OFF causes current to cease flowing in the first inductor section. Since this current has to be returned through the second switch control grid, the second switch is interrupted. The optional pull-down resistors are included to insure that voltage appears across the anode to control-grid gaps rather than across the control-grid to cathode gap. When operated in this manner, the switches act as current amplifiers with a roughly 1 to 1 gain, helping to force nearly equal currents in the coils of the inductor L.

The master-slave configuration of FIGS. 6(a) and 6(b) eliminate the need for multiple control circuits with associated cost and timing problems.

FIG. 7 shows a simplified schematic diagram of a current amplifier or voltage regulator constructed in accordance with the present teachings. The amplifier 80 includes a cold cathode grid-controlled, crossed field plasma switch 82 having a current source 84, providing a current I, connected between the cathode 32 and the control grid 36 thereof. A load resistor $R_L$ and a capacitor C are connected between the anode 38 and the control grid 36 of the switch 82. The load resistor $R_L$ limits the load current to the anode 38 of the switch 82. In this configuration, the current flowing in the loop from the anode 38 to the control grid 36 is proportional to the current flowing between the cathode 32 and the control grid 36 by a gain factor $\beta$. The value of $\beta$ depends upon the design of the switch and its operating conditions. For purposes of master-slave switching we assume that $\beta$ is set to be nearly equal to unity.

Figure 8A:
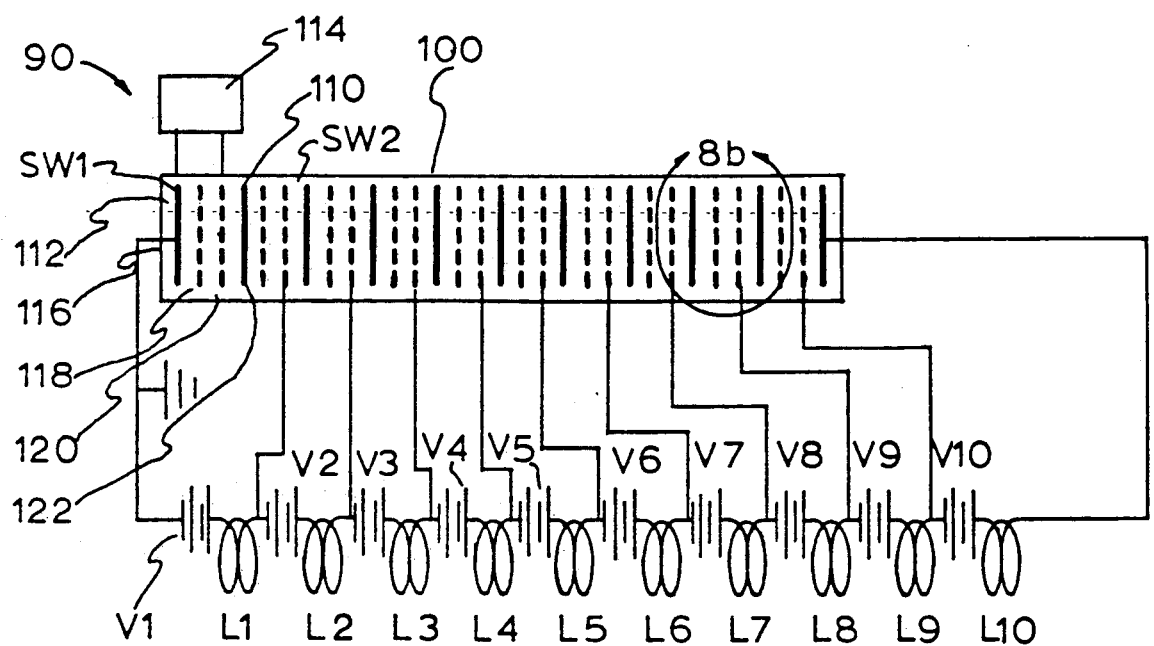
FIG. 8(a) is a simplified illustration of an alternative implementation of the inductive high voltage power supply of FIG. 6(b).

FIG. 8(a) is a simplified illustration of an alternative implementation of the inductive high voltage power supply of FIG. 6(b). The system 90 includes the compact cold cathode grid-controlled, crossed field plasma switch 100 of the present invention, which includes a plurality of identical switch elements 110 within a single enclosure 112. Each switch 110 includes a cathode 116, a source grid 118, a control grid 120 and an anode 122. Note that the anode 122 of the first switch SW1 also serves as the cathode 116 of the second switch SW2. This allows for an advantageous compact construction.

A master control unit 114, of the type disclosed above, is connected between the cathode 116 and the control grid 120 of the first switch element SW1. The cathode 116 of the first switch SW1 is connected to a grounded cathode of a first battery supply V1. The anode of the first battery supply V1 is connected to the first of a plurality of coils L1–L10, each of which has an associated battery supply V2–V10 therebetween. The batteries V1–V10 are relocated into the inductive chain to reduce the size of the switch 100. The second end of each coil L1–L10 is connected to a control grid 120 of an associated switch element 110 of the compact cold cathode grid-controlled, crossed field plasma switch 100.

Figure 8B:
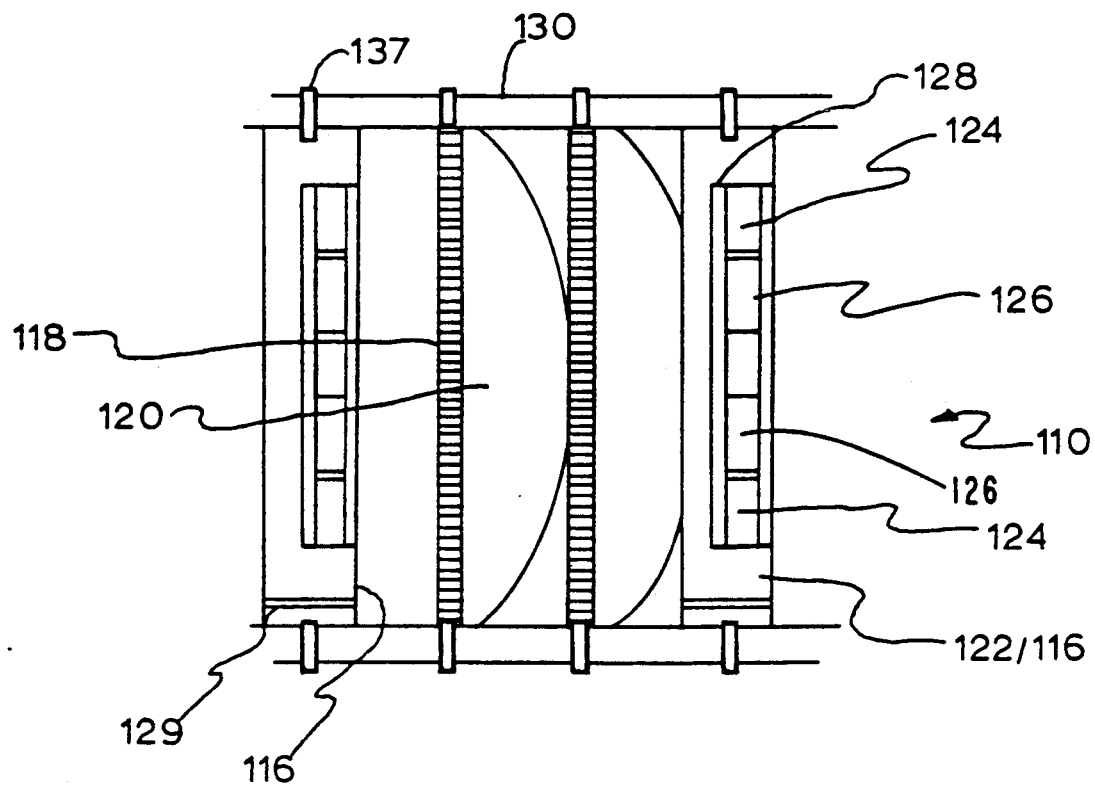
FIG. 8(b) is a magnified view of a single switch element of the improved cold cathode grid-controlled, crossed field plasma switch of FIG. 8(a).

FIG. 8(b) is a magnified view of a single switch element 110 of the improved cold cathode grid-controlled, crossed field plasma switch 100 including a planar cathode 116, a source grid 118, a control grid 120, and a dual purpose anode/cathode 122/116, all mounted in mutual parallel relation. The cathode/anode elements 116/122 each include two pairs of magnets 124 and 126. As shown, the magnets 124 and 126 are arranged in a planar, ringcusp configuration, that is, two or three magnetic rings with alternating polarity. The magnets are strong enough to serve to activate the region between the cathode 116 and source grid 118 when a voltage around 500v is applied to the source grid, thereby generating a crossed-field discharge (according to the principles set forth by the prior art of Harvey and Schumacher et al.). The cathode structure 116 is contiguous with the anode surface of the preceding switch element and is supplied with a flux bridge 128 of a magnetically permeable material to avoid penetration of unwanted field into the anode region. The cathode/anodes 116/122, source grid 118, and control grid 120 are brazed in place within a vacuum wall 130. The vacuum wall 130 is a concentric insulating tube of a material such as alumina and serves as the body of the switch 100. The braze connections 132 provide external electrical connections through the vacuum wall 130. High voltage grading (not shown) inside and outside of the switch follow conventional tube-engineering practice. Internal pressure control is provided by a conventional hydrogen-gas reservoir located in the first section and gas is allowed to penetrate through small openings 129 in the cathode structures 116 located away from the plasma discharge region. The remaining elements of the switch 100 are of conventional construction.

FIG. 9 is a high voltage interruptable crowbar switch implementation of the compact cold cathode grid-controlled, crossed field plasma switch 100 of the present invention. The construction of the compact cold cathode grid-controlled, crossed field plasma switch 100 is the same as that of FIGS. 8(a) and (b). The batteries and inductive elements are replaced with capacitive or resistive grading elements shown here as C1–C10. Again, the resistors and supplies are omitted for the purpose of illustration.

Operation of the compact cold cathode grid-controlled, crossed field plasma switch 100 is essentially the same as that of FIGS. 6(a) and (b). However, in power utility service it would normally be maintained in the OFF state until a closure is required. It would then be turned ON to clear a fault and then OFF to reset. Thus, the present invention has been described with reference to particular embodiments for illustrative applications. Those of ordinary skill in the art having access to the present teachings will recognize additional modifications, applications and embodiments within the scope thereof. For example, the compact cold cathode grid-controlled, crossed field plasma switch of the present invention can be used in other high voltage circuits such as converters, inverters, regulators, resonant charging, and protection circuits.

Thus, it is intended by the appended claims to cover any and all such applications, modifications and embodiments within the scope of the present teachings.

Accordingly,

What is claimed is:

1. A high voltage, Marx bank power supply comprising:
   a plurality of energy storage elements;
   supply means for charging said energy storage elements; and
   switching means for switching said energy storage elements into electrical contact with a load, a said switching means including a plurality of interruptible switches for interrupting current against high voltages, at least one interruptible switch positioned between adjacent energy storage elements and capable of switching current ON or interrupting current in the presence of high voltage to achieve a desired pulse length.

2. A high voltage power supply comprising;
   energy storage means;
   supply means for charging said energy storage means; and switching means for switching said energy storage means into electrical contact with a load, said switching means including at least one interruptible switch, wherein said interruptible switch is a cold cathode grid-controlled, crossed field plasma switch.

3. The invention of claim 2 wherein said switching means includes a control circuit associated with each cold cathode grid-controlled, crossed field plasma switch.

4. The high voltage power supply of claim 2 wherein said plasma switch comprises plural switching elements in a single enclosure each switching element including a cathode, a control grid and an anode, the cathode of at least one switching element being the anode of another switching element.

5. A high voltage power supply of claim 2, wherein said energy storage means comprises a plurality of capacitive elements connected in a parallel arrangement; and said switching means is for switching said capacitive elements into a series arrangement across a load.

6. The invention of claim 5 wherein said switching means includes a control circuit associated with each said cold cathode grid-controlled, crossed field plasma switch.

7. The invention of claim 5 wherein said switching means includes plural cold cathode grid-controlled, crossed field plasma switches each having a cathode, an anode, and a control grid therebetween.

8. The invention of claim 7 including a master control circuit associated with a first of said plurality of switches, and wherein said switches other than said first switch are connected to operate in a slave manner with respect thereto.

9. The invention of claim 5 including pulse forming network means for providing a regulator for said power supply.

10. The high voltage power supply of claim 2 wherein said energy storage means comprises a plurality of inductive elements connected in a series arrangement, and said switching means is for switching said inductive elements into a parallel arrangement across a load.

11. The invention of claim 10 wherein said switching means includes a control circuit associated with each cold cathode grid-controlled, crossed field plasma switch.

12. A high voltage power supply comprising:
a plurality of capacitive elements connected in a parallel arrangement;
supply means for charging said capacitive elements;
switching means for switching said capacitive elements into a series arrangement across a load, said switching means including:
plural cold cathode grid-controlled, crossed field plasma switches, each having a cathode, an anode, and a control grid therebetween,
a control circuit associated with each cold cathode grid-controlled, crossed field plasma switch,
a master control circuit associated with a first of said plurality of switches, said remaining switches being connected to operate in a slave manner with respect to said first switch and
pulse forming network means for providing a regulator for said power supply, said pulse forming network means including a pulse forming network connected between the cathode and the control grid of said first cold cathode grid-controlled, crossed field plasma switch.

13. A high voltage power supply comprising:
a plurality of inductive elements connected in a series arrangement;
supply means for charging said energy storage means;
switching means for switching said inductive elements into a parallel arrangement across a load, said switching means including:
plural cold cathode grid-controlled, crossed field plasma switches, each having a cathode, an anode, and a control grid therebetween,
a control circuit associated with each cold cathode grid-controlled, crossed field plasma switch,
a master control circuit associated with a first of said plurality of switches, said remaining switches being connected to operate in a slave manner with respect to said first switch and
pulse forming network means for providing a regulator for said power supply, said pulse forming network means including a pulse forming network connected between the cathode and the control grid of said first cold cathode grid-controlled, crossed field plasma switch.

14. A high voltage power supply comprising:
a plurality of capacitive elements connected in parallel arrangement;
supply means for charging said plurality of capacitive elements; and
switching means for switching said capacitive elements into a series arrangement across a load, said switching means including at least one cold cathode grid-controlled, crossed field plasma switch.

15. The high voltage power supply of claim 14 wherein said plasma switch comprises plural switching elements in a single enclosure each switching element including a cathode, a control grid and an anode, the cathode of at least one switching element being the anode of another switching element.

16. A high voltage power supply comprising:
a plurality of inductive elements connected in a series arrangement;
supply means for charging said inductive elements; and
switching means for switching said inductive elements into a parallel arrangement across a load, said switching means including at least one cold cathode grid-controlled, cross field plasma switch.

17. The high voltage power supply of claim 16 wherein said plasma switch comprises plural switching elements in a single enclosure each switching element including a cathode, a control grid and an anode, the cathode of at least one switching element being the anode of another switching element.

18. The invention of claim 16 wherein said switching means includes a control circuit associated with said cold cathode grid-controlled, crossed field plasma switch.

19. The invention of claim 16 wherein said switching means includes plural cold cathode grid-controlled, crossed field plasma switches each having a cathode, an anode, and a control grid therebetween.

20. The invention of claim 19 including a control circuit associated with each cold cathode grid-controlled, crossed field plasma switch.

21. The invention of claim 20 including a master control circuit associated with a first of said plurality of switches.

22. The invention of claim 21 wherein said switches other than said first switch are connected to operate in a slave manner with respect thereto.

23. The invention of claim 22 including pulse forming network means for providing a regulator for said power supply.

* * * * *

UNITED STATES PATENT AND TRADEMARK OFFICE
CERTIFICATE OF CORRECTION

PATENT NO.  : 5,008,798
DATED       : April 16, 1991
INVENTOR(S) : Robin J. Harvey It is certified that error appears in the above-identified patent and that said Letters Patent is hereby corrected as shown below:

On the title page, Item [75]: Inventor should read --ROBIN J. HARVEY-- and Col 10, Claim 1, line 7, after "load," delete the word "a".

Signed and Sealed this

Twenty-ninth Day of June, 1993

Attest:

MICHAEL K. KIRK

Attesting Officer

Acting Commissioner of Patents and Trademarks